(12) United States Patent
Ames et al.

(10) Patent No.: US 6,627,867 B2
(45) Date of Patent: Sep. 30, 2003

(54) INTEGRATED FIBER OPTIC RECEIVER POWER METER

(75) Inventors: Stephen John Ames, Rochester, MN (US); Michael William Marlowe, Rochester, MN (US); Christopher K. White, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 106 days.

(21) Appl. No.: 09/989,826

(22) Filed: Nov. 20, 2001

(65) Prior Publication Data

US 2003/0098407 A1 May 29, 2003

(51) Int. Cl.[7] .................................................. H01J 40/14
(52) U.S. Cl. .................................. 250/214 R; 359/152
(58) Field of Search ........................ 250/214 R, 214 A, 250/214 LA, 214.1; 356/221–226; 359/152, 154, 189; 330/308, 59; 369/46, 44.11, 44.29–44.36

(56) References Cited

U.S. PATENT DOCUMENTS 5,920,438 A * 7/1999 Christensen et al. .......... 360/46
5,956,168 A 9/1999 Levinson et al. ............ 359/152
6,528,777 B2 * 3/2003 Ames et al. .............. 250/214 R

OTHER PUBLICATIONS

U.S. patent application Ser. No. 09/955,545, entitled "Laser Diode Monitoring Via Current Mirroring", filed on Sep. 18, 2001 by Stephen John Ames et al. (ROC920000318US1).
U.S. patent application Ser. No. 09/761,526, entitled "Transimpedance Amplifier With an In–Situ Optical Power Meter", filed on Nov. 16, 2000 by Stephen J. Ames et al. (ROC920000245US1), Now U.S. patent No. 6,528,777.

* cited by examiner

*Primary Examiner*—Que T. Le
(74) *Attorney, Agent, or Firm*—Wood, Herron & Evans, LLP

(57) ABSTRACT

An apparatus, circuit arrangement and method enable a host system to read a signal that is proportional to the peak-to-peak optical power incident on a transceiver at one end of a fiber optic link without breaking that link. By reading this signal and being aware of the characteristics of the laser, the "health" of the laser is known and the integrity of the link is maintained. Consequently, the host system has a predictive tool that is able identify substandard lasers so that such lasers can be replaced before serious, and potentially costly, data disruptions occur.

26 Claims, 3 Drawing Sheets

INTEGRATED FIBER OPTIC RECEIVER POWER METER

FIELD OF THE INVENTION

The invention is generally related to laser transceivers and fiber optic communication links. More specifically, the invention is related to monitoring operational performance of fiber optic communication links.

BACKGROUND OF THE INVENTION

Today, optical fibers form the backbone of a global telecommunication system. These strands of glass, each thinner than a human hair, are designed to carry huge amounts of data transmitted by tightly focused laser beams. Together, optical fibers and lasers have dramatically increased the capacity of the telephone and data systems. With equal improvements in computing, mankind has become dependant on this communication technology.

Thus, maintaining the integrity of a fiber optic communications link has become critical, particularly in these high capacity telephone and data systems. Failure to properly maintain a link can result in severed communications as well as data disruptions since both voice and data may be carried on the same fiber. This can lead to lost revenues since people often do not reestablish calls once they have been interrupted or "dropped." Further, reestablished calls and data links must be rerouted by the host system over another link. This results in delays as well as the additional time and effort required for rerouting, not to mention reduced system capacity.

Often, breaks in these links can be traced to failures of laser diodes that transmit data over these fibers. These laser diodes function to transmit voice and data through modulation of their photonic emission. Laser diodes are "biased" by a DC current which causes them to emit radiation at a particular frequency. This emission frequency is then varied, or "modulated," by an AC current in response to voice or data which is desired to be transmitted. Experience has shown that most laser diodes do not fail catastrophically but rather slowly deteriorate in performance, drawing more and more bias and modulation current to generate the amount of output power necessary to maintain the link. At some point, the amount of current required becomes so burdensome to the electronic driver that the link is broken.

Once a link breaks, a technician must be dispatched to diagnose and repair the broken link. Oftentimes, the technician must disconnect the optical fiber from the transceiver located at the opposite end of the link from the laser diode and connect it to an optical power meter in order to measure the emitted optical power from the transceiver. Based on the measured power, a diagnosis is made by the host system. Optical power transmitted from the laser diode must pass through an optical system of complex interconnections before reaching a transceiver. Many times, the optical output power is too low due to a failure of the laser diode in the laser module. Other times, the break in the link is due to a failure of a connection in the link itself. Optical fibers can be up to 10 km in length and can be spliced and optically switched as well. Optical attenuation along this path is a reality. Lasers experience optical attenuation along the network due to damaged or dirty optical interconnects. In either case, the end result is reduced modulated optical power reaching the transceiver disposed at the opposite end of the link.

This process of measuring the optical power incident on a transceiver can also be performed in an effort to predict potential failures in the future. However, the skill of the technicians which perform the measurements becomes paramount as the orientation of the fiber in relation to the optical power meter can significantly effect the amount of power measured. This along with the amount of time, effort, and manpower, as well as the reduced system capacity, that accompany this approach make service providers which use fiber optic links reluctant to use this process.

Therefore, a significant need exists in the art for a manner of monitoring the optical power incident on a transceiver in a fiber optical link without breaking the link.

SUMMARY OF THE INVENTION

The invention addresses these and other problems associated with the prior art by providing an apparatus, circuit arrangement, and method that monitor the optical power received by a transceiver in a fiber optical link without having to break the link. The optical power incident on a photo-detector configured to receive an optical from an optical fiber is monitored in part through the use of a receiver circuit coupled to the photo-detector and configured to generate a data signal representative of information encoded in the received optical signal and a monitor signal that is proportional to the peak-to-peak optical power of the received optical signal. By providing a signal which is proportional to incident peak-to-peak optical power, a host system such as a computer or other data processing system has the ability to read a signal and calculate, as desired, the peak-to-peak optical power received by a transceiver in a fiber optic link without breaking the link. Thereby, the host system is further able to determine laser performance and preempt laser failure of a laser disposed in another transceiver at the other end of a link that may not be detected by an average power meter.

In one embodiment consistent with the invention, a monitor voltage is presented directly to an analog-to-digital converter within the host system. In another embodiment of the invention, the monitor signal is digitized in a receiver circuit and delivered to the host system via a digital interconnect. In the embodiments, the host system is operative, using coefficients located in the transceiver nonvolatile memory, to calculate the optical power by reading the monitor signal. As such, the host system is capable of monitoring the peak-to-peak optical power received by a transceiver in a fiber optic link without disrupting the link.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there are described exemplary embodiments of the invention.

DETAILED DESCRIPTION

Figure 1:
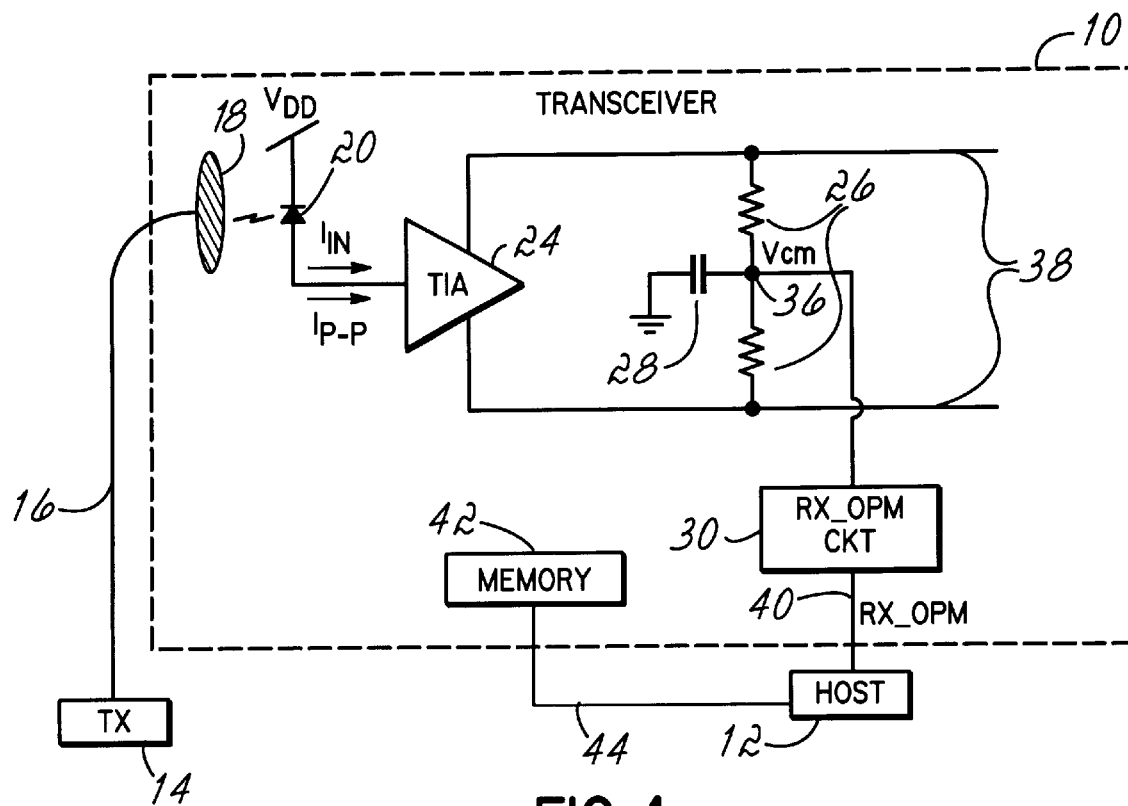
FIG. 1 is a block diagram of a photo-detector disposed in a fiber optic communication link transceiver supported by a host system, illustrating the signals used for monitoring the peak-to-peak optical power incident on the transceiver in a manner consistent with the present invention.

Turning to the Drawings, wherein like numbers denote like parts throughout the several views, FIG. 1 illustrates a block diagram of a fiber optic communications link transceiver 10 supported by a host system 12 consistent with the present invention. As further shown in FIG. 1, a fiber optic data link transmitter 14 is linked to transceiver 10 through an optical fiber 16. The transmitter 14 transmits data in the form of modulated light as is well known in the art, and may be part of a transceiver, incorporating an embodiment of the invention as will be shown in conjunction with FIG. 3 hereinafter.

The optical fiber 16 is coupled to the transceiver 10 via a lens 18 incorporated into an electro-optical package with a photodetector 20, such as a photo-diode, and focuses modulated light from the transmitter 14 and carried by the fiber 16 onto the photodetector 20. The light impinging on the photodetector 20 modulates the current through the photodetector 20 in response to variations in the light representing digital data carried by the fiber 16. However, other electronic devices having functionality similar to the photodetector and packaged in a like or different manner could be used without departing from the scope of the invention.

The variations in the current through photodetector 20 cause a transimpedance amplifier 24 to sink more or less current from power supply ($V_{DD}$) in relation to the digital data. The general use and configuration of the transimpedance amplifier in the exemplary environment is described, for example, in U.S. patent application Ser. No. 09/761,526, filed on Nov. 16, 2000 by Stephen J. Ames et al., entitled "TRANSIMPEDANCE AMPLIFIER WITH AN IN-SITU OPTICAL POWER METER", the disclosure of which is incorporated by reference herein.

Here, as in most systems, a photo-diode is used in the transceiver to demodulated the optical signal thus generating a data signal. As previously mentioned, the photo-diode is typically integrated into an electro-optical package and receives the light through a lens. Further, in certain implementations, a transimpedance amplifier may also be integrated into the electro-optical package. These electro-optical packages having a lens and containing a photo-diode and a transimpedance amplifier are generally limited in the number of pins available for external connection. This pin restriction limits the technology useable for power monitoring to simple AC signal conditioning. As such, these transceivers provide no externally readable monitor feature which describes the laser power incident on the transceiver. Rather, the only indicator available from the photo-diode is that which carries the data signal. The herein described embodiments process the data signal to overcome this pin limitation as well as provide additional benefits as described herein below.

One skilled in the art will recognize that the present invention is not limited those implementations in which a photo-diode and a transimpedance amplifier are disposed in the same electro-optical package; but rather, applies in the broader context of all implementations wherein a data signal is processed to provide a monitor signal that is proportional to the peak-to-peak optical power.

Included in the transimpedance amplifier 24 is a circuit that extracts the peak-to-peak content of the modulated input current ($I_{IN}$), which is designated as $I_{P-P}$ in FIG. 1. This circuit is known in the art as a full-wave rectifier and many take the form of a variety of circuit topologies including rectifiers, diodes, bridges, as well as other devices that may be configured to have similar functionality. Internal to the transimpedance amplifier 24, the rectified peak-to-peak current ($I_{P-P}$) is used to control the common-mode voltage between the differential data outputs 38.

Two resistors 26 are connected in series across the differential outputs 38 and develop a common-mode voltage ($V_{CM}$) at node 36. The values of the resistors 26 are preferably selected so as to not excessively load the differential data outputs 38 of the transimpedance amplifier 24. For example, and as is well know in the art, the values of the resistors 26 may be selected so their value when connected in series is at least ten times the differential output impedance of the transimpedance amplifier 24. This ensures the signal integrity of the transimpedance amplifier 24 differential data outputs 38.

Also present at the node 36 between the resistors 26 where the common-mode voltage ($V_{CM}$) is developed, are AC signal components associated with the digital data, the rectification process, imbalances between the differential data outputs 38, etc. that must be filtered out so that the common-mode voltage ($V_{CM}$) is representative of the peak-to-peak optical power incident on the photo-detector. As such, the AC signal components present at the node between the resistors 26 are referred to as having frequency content that is "broadband" in nature, referring to the fact that both high frequency and low frequency components are present.

The filtering of these broadband components is accomplished through the use of a capacitor 28 in conjunction with resistors 26. Together the resistors 26 and the capacitor 28 form a first order resistance/capacitance (RC) filter, as is also well known in the art. The value of the capacitor 28 is selected so that the RC time constant of the filter addresses the broadband nature of the AC signal components.

Both the high frequency and low frequency components are of concern. The selection of the RC time constant is primarily targeted at maintaining enough low frequency content to avoid a drop in the common mode voltage ($V_{CM}$). Since it is possible for the digital data to have repetitive sequences of logic "1" and "0," the integrated power in the waveform will be reduced if the low frequency cut-off is too high. In addition, the RC time constant must be selected so that the filter "smooths" or "averages out" the high frequency content of the common mode voltage ($V_{CM}$). When the RC time constant is properly selected, the common-mode voltage ($V_{CM}$) is representative of the peak-to-peak optical power incident on the photo-detector 20. The common-mode voltage ($V_{CM}$) is coupled to a receiver output power meter circuit (RX_OPM CKT) 30.

The receiver output power meter circuit (RX_OPM CKT) 30 is functional to condition the common-mode voltage ($V_{CM}$) so that an analog output signal (RX_OPM), which is proportional to the peak-to-peak optical power incident on the photo-detector 20, is presented on a signal path 40 to an analog to digital convertor in the host system 12. In alternative embodiments of the present invention, the transceiver 10 may include an analog to digital convertor such that a digital representation of the output signal (RX_OPM) is presented to the host system 12 in either a serial or parallel data format. As described, a receiver circuit may include, either alone or in combination, a transimpedance amplifier, a filter, an output power meter circuit and an analog to digital convertor, as well as other components that will be apparent to one of ordinary skill in the art having the benefit of the instant disclosure.

The host system 12 is then functional, with coefficients downloaded from a memory 42 via a bus 44 (e.g., such as a serial bus), to calculate the received peak-to-peak optical power ($P_{IN}$) The coefficients are determined during the manufacturing process of the transceiver 10 and stored in memory 42, such as non-volatile memory, thereby characterizing the performance of the photo-detector 20 used in conjunction with the transimpedance amplifier 24.

Due to the non-linearities of the receiver optical power meter circuit 30 with respect to the received optical power ($P_{IN}$), a polynomial equation may be used to calculated the received peak-to-peak optical power ($P_{IN}$) For example, a polynomial equation which has the form: $P_{IN}=A_0+A_1*(RX\_OPM)+A_2*(RX\_OPM)^2$, wherein the host system 12 has downloaded the coefficients $A_0$, $A_1$, and $A_2$, may be used to calculate the peak-to-peak optical power ($P_{IN}$)

Alternatively, a threshold level for the output signal (RX_OPM) may be set whereby the host system 12 selects between the polynomial equation described hereinabove and a linear equation when calculating the peak-to-peak optical power ($P_{IN}$). In the later case, a linear equation may have the form: $P_{IN}=A_3+A_4*(RX\_OPM)$, where the host system 12 has also downloaded the coefficients $A_3$ and $A_4$.

Hence, by reading the instantaneous RX_OPM voltage and plugging it into an equation, a computed peak-to-peak optical power is accomplished. Thus, the present invention allows the fiber optic link to function as a data link while monitoring the peak-to-peak optical power at all times.

Further, the present invention provides a peak-to-peak optical power meter rather than the usual average power meter. The peak-to-peak optical power is more useful in that it directly measures the modulated optical character of a signal carried by an optical fiber. It is well know that laser transmitters having failing laser diodes attempt to compensate by increasing the DC bias current to the laser in order to maintain constant output power. However, once the modulated current limit is reached, further increases in DC bias current raise the DC optical output power, but not the modulated output power. This increase in the DC optical power may, in effect, compensate for the loss of modulated output power when measuring with an average power meter. Thus, when measuring with an average power meter a failing laser diode may not be detected. However, the present invention would detect the reduction in the modulated output power indicating a failure of the laser diode.

Figure 2:
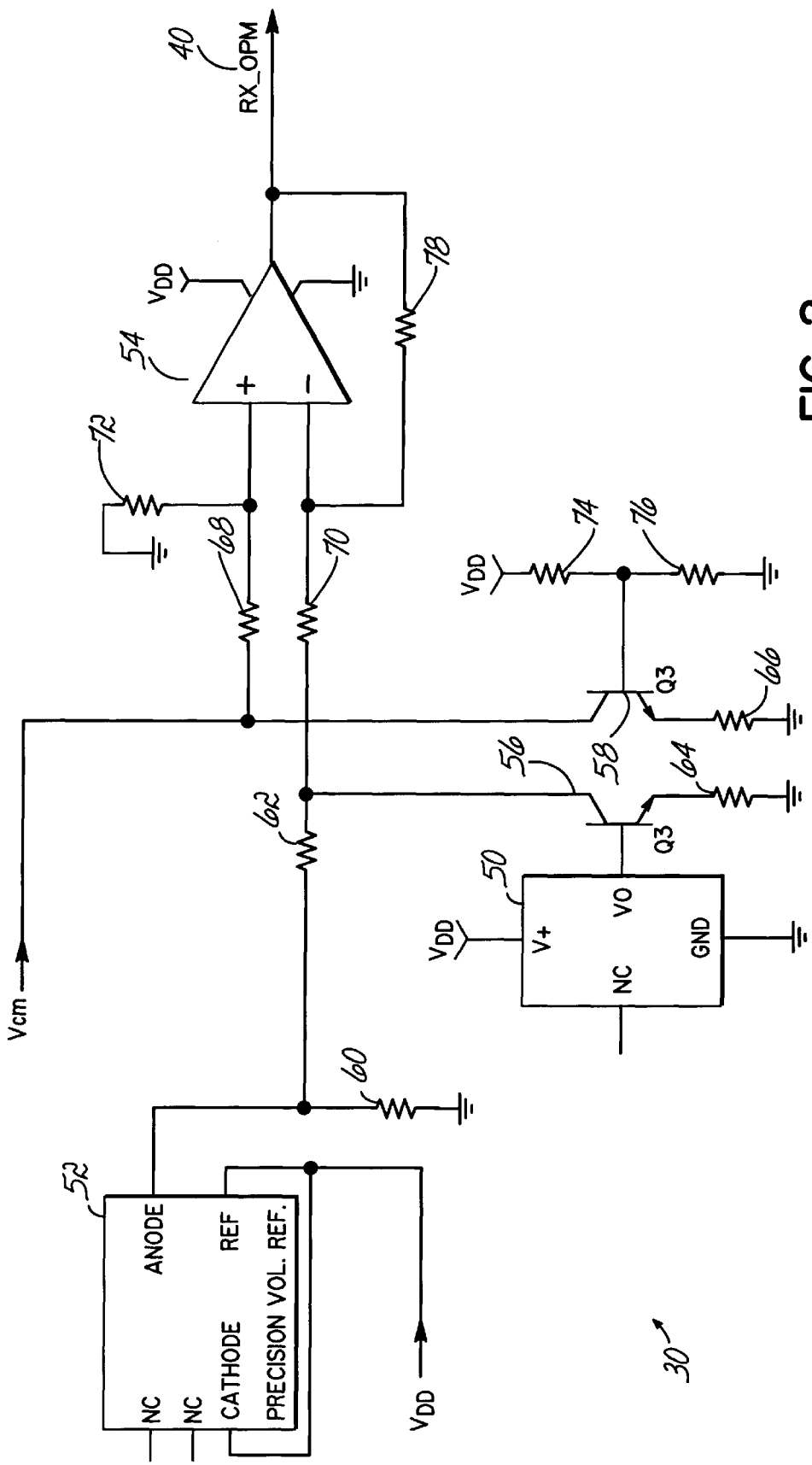
FIG. 2 is a block diagram of an embodiment of the receiver optical power meter circuit of FIG. 1.

Turning now to FIG. 2, an embodiment of the receiver optical power meter circuit 30 of FIG. 1 is illustrated. The features of the embodiment in FIG. 2 include temperature compensation, power supply collection, and voltage offset correction or gain. However, other embodiments may provide any of these features alone or in combination without departing from the spirit of the invention.

For example, the transimpedance amplifier 24 from which the common mode voltage ($V_{CM}$) originates, as shown in FIG. 1 and incorporated by reference herein, may have thermal characteristics that affect the accuracy of the peak-to-peak optical power measured. Similarly, the transimpedance amplifier 24 may be subject to power supply variations that affect the accuracy of the peak-to-peak optical power measured. In addition, the common mode voltage ($V_{CM}$) may need to be amplified or offset so that it is able to be resolved by certain host analog-to-digital convertors.

Turning to the particulars of the circuit in FIG. 2, a commonly available integrated circuit having a thermal behavior characteristic that is inversely proportional to the transimpedance amplifier 24 thermal behavior is used to provide temperature compensation thereby flattening the overall thermal response of the common mode voltage ($V_{CM}$). As shown in FIG. 2, a National Semiconductor LM20 micro SMD temperature sensor 50 with a sensor gain of −11.7 mV/°C. is employed. However, other temperature sensors having suitable thermal characteristics for the referenced transimpedance amplifier 24 or other transimpedance amplifiers may be optionally used without departing from the spirit of the invention.

Another commonly available integrated circuit is used to compensate for variations in the transimpedance amplifier power supply ($V_{DD}$) by providing a precision voltage reference. As also shown in FIG. 2, a National Semiconductor LMV431A adjustable precision shunt regulator is configured as a precision voltage reference 52 thereby compensating for variations in the power supply ($V_{DD}$). Again, compensation for variation in the power supply may be used as desired without departing from the scope of the invention.

An operational amplifier 54 serves as the summing junction for the thermal compensation and supply voltage compensation for the common mode voltage ($V_{CM}$) and provides gain compensation. As shown, half of a National Semiconductor LMC6035 low power dual operational amplifier 54 raises the gain so that the minimum value of the signal RX_OPM 40 is of sufficient magnitude to be resolved by an analog to digital convertor in the host system 12. As shown, the voltage gain of the operational amplifier 54 is set at 2 based on the values selected for resistors 68, 70, 72, and 78, as is well know in the art. Exemplary values for resistors 68, 70, 72, and 78 are provided hereinafter in tabular format.

More specifically, the temperature sensor 50 biases the base of one of a differencing pair of transistors 56, and along with resistors 60, 62, and 64 sets the nominal voltage at the inverting input of the operational amplifier 54. The base of the other differencing transistor 58, preferably housed in the same package with matched gain and similar thermal characteristics as differencing transistor 56, is biased by a voltage divider formed by resistors 74 and 76 and sets the nominal voltage at the non-inverting input of the operational amplifier 54 along with resistor 66. Thus, when the temperature changes or the power supply voltage ($V_{DD}$) fluctuates, the nominal voltage seen at the inverting input of the operational amplifier 54 is adjusted to compensate so that the common mode voltage ($V_{CM}$) presented to the non-inverting input of the operational amplifier 56 is proportional to the peak-to-peak optical power incident on the photo-detector 20. Exemplary values for resistors 60, 62, 64, 66, 74, and 76, as well 68, 70, 72, and 78 are provided in the following table:

FIG. 2 Exemplary Resistor Values

| Resistor | Value (k ohms) |
| --- | --- |
| 60, 62, 74, 76 | 1 |
| 64 | 16.2 |
| 66 | 40.2 |
| 68, 70 | 100 |
| 72, 78 | 200 |

While certain values and types of components have been discussed in conjunction with the description of the receiver optical power meter circuit 30, such values and components merely exemplify a variety of components and values that may be selected by one skilled in the art. As such, it will appreciated that different embodiments may use different components having different values without departing from the spirit of the invention.

Figure 3:
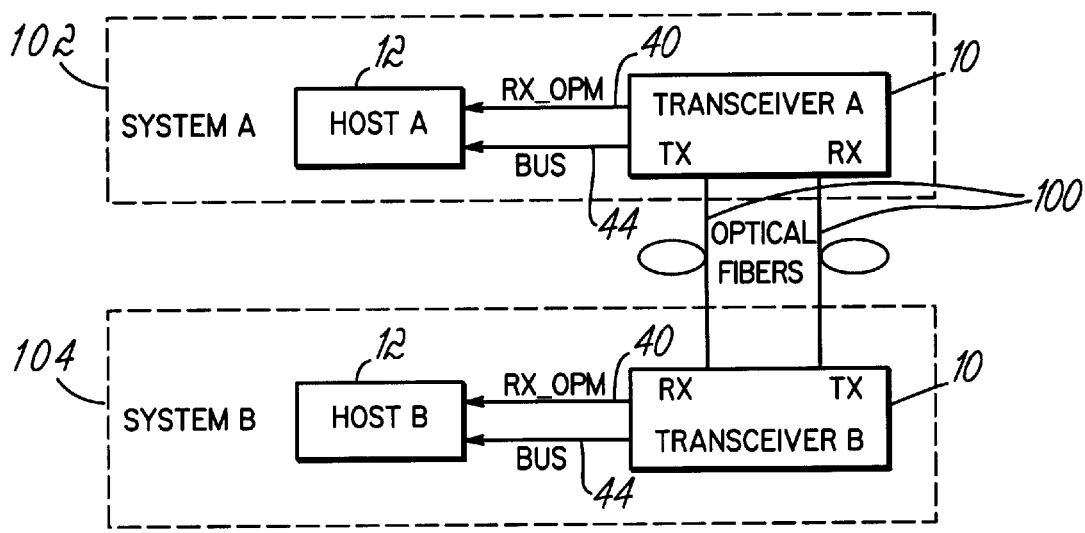
FIG. 3 is a block diagram of two systems, each incorporating a fiber optic communication link transceiver having the configuration shown in FIG. 1, connected by a duplex fiber optic link.

Turning to FIG. 3, a block diagram of two systems 102, 104, each containing the transceiver 10 described hereinbefore, connected by a duplex fiber optic link 100 is shown. In these systems 102, 104, the hosts 12 download via a bus 44 the coefficients $A_0$, $A_1$, $A_2$, $A_3$, and $A_4$, necessary to calculate the peak-to-peak optical power received from the duplex fiber optic link 100. Once the downloads are complete, the hosts 12 may sample the RX_OPM voltages on lines 40. The hosts 12 may then, using the respective downloaded coefficients ($A_0$, $A_1$, $A_2$, $A_3$, and $A_4$), utilize the afore-provided equations to calculate the peak-to-peak input power ($P_{IN}$) of each transceiver 10. The hosts 12 may then be made operational using software to determine the "health" of the laser. Thus, an advantage of the present invention is that a host may be disposed to monitor the link 100 in "real-time" and predict laser failure. Notice of such potential failure could be provided to a system manager that could then schedule maintenance before the link failed. The present invention also provides for collection of historical performance data on lasers used in such links. As such, the systems 102, 104 have a predictive tool that is able identify substandard lasers and replace them before a serious, and potentially costly, data disruption occurs.

Once again, it will be appreciated that embodiments of the present invention discussed in conjunction with FIGS. 1 and 2 apply equally as well in the systems 102, 104 shown in FIG. 3. Further, the systems 102, 104 in FIG. 3, could be a telephone and/or data system or a telecommunication system including any voice and data application. Similarly, the hosts 12 depicted FIG. 3 could be any computer or data processing system that has the ability to read and/or monitor a signal which is proportional to the input peak-to-peak optical power of the transceivers 10. One skilled in the art will understand that although a host was shown for each system in FIG. 3, a single host could be configured to download coefficients, read signals, and calculate power from a plurality of transceivers or lasers.

Figure 4:
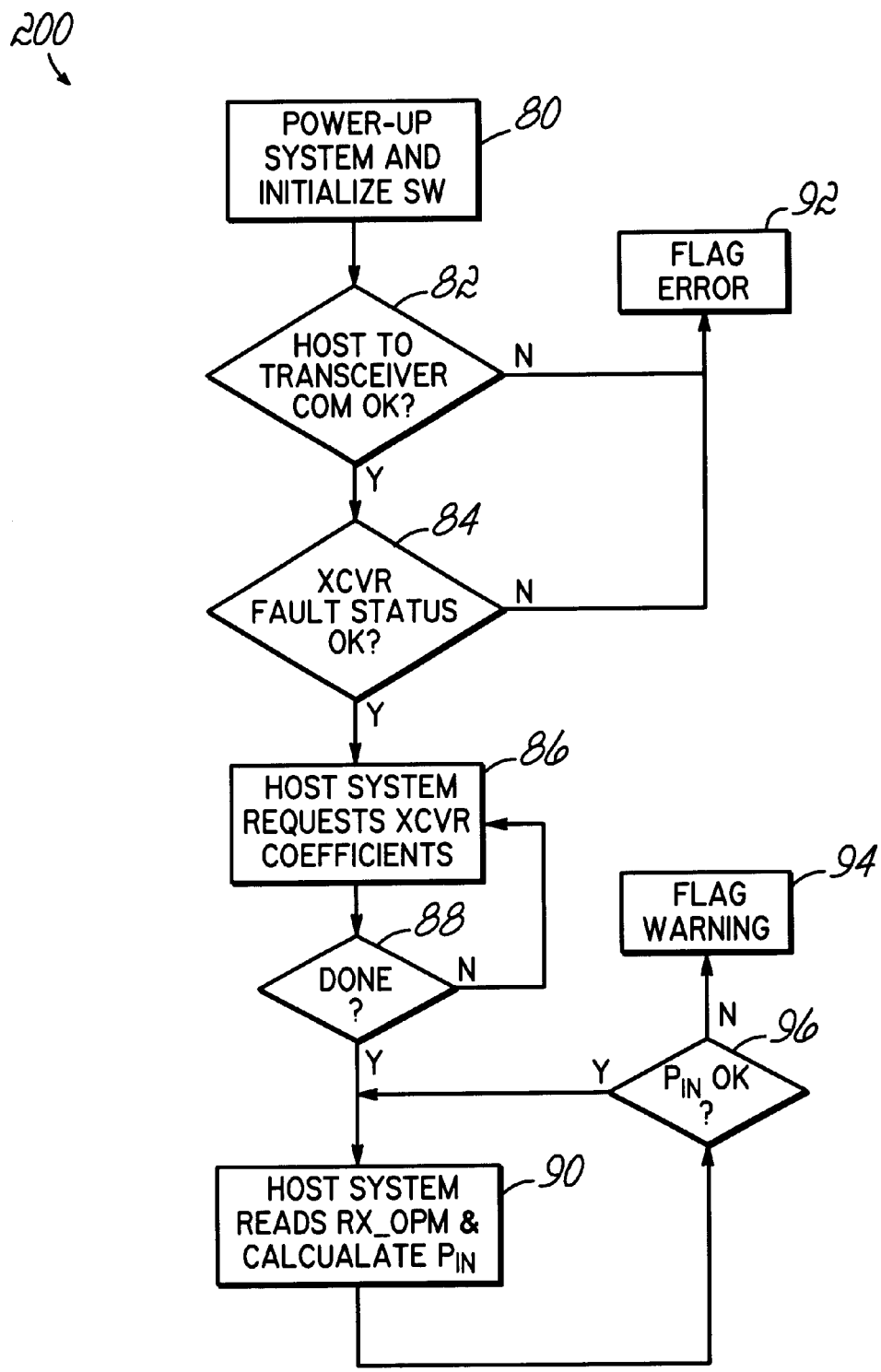
FIG. 4 is a flowchart illustrating the program flow of a process of monitoring the peak-to-peak optical power incident on the transceivers in the host systems of FIGS. 1 and 3.

Turning now to FIG. 4, a flowchart illustrating the program flow of a process 200 of monitoring the peak-to-peak input power of the hosts 12 of FIGS. 1 and 3 is shown. The process 200 begins by powering up a system 102, 104 and initializing the software as shown in block 80. Control is then passed to block 82 which locally determines whether the host 12 can communicate with the transceiver 10. If communication cannot be established, an error tag is set at block 92 and the process ceases. If communication is established, control of the process is passed to block 84. Block 84 locally determines whether the transceiver 10 is in fault status. If the transceiver 10 is in fault status, once again, an error flag is set in block 92 and the process ceases. However, if the transceiver is not in fault status, control is passed to block 86. In block 86, the host 12 requests the coefficients ($A_0$, $A_1$, $A_2$, $A_3$, and $A_4$) necessary to calculate the peak-to-peak input power ($P_{IN}$). Next, block 88 continually loops control of the process to ensure that the host 12 receives the coefficients ($A_0$, $A_1$, $A_2$, $A_3$, and $A_4$). Once the coefficients ($A_0$, $A_1$, $A_2$, $A_3$, and $A_4$) are received by the host 12, control is passed to block 90. In block 90 the host 12 reads the RX_OPM voltage, be it represented in analog or digital format, and calculates the peak-to-peak input power ($P_{IN}$). Once the peak-to-peak input power ($P_{IN}$) has been calculated, control passes to block 96 wherein it is determined whether or not the peak-to-peak input power ($P_{IN}$) is acceptable. If the peak-to-peak input power ($P_{IN}$) is acceptable, control is returned to block 90 and the process proceeds as before. If the peak-to-peak input power ($P_{IN}$) is not acceptable, a warning flag is set in block 94 which signifies that a substandard laser diode should be replaced before a serious, and potentially costly, data disruption occurs.

Those skilled in the art will recognize that the exemplary environments illustrated in FIGS. 1, 2, 3, and 4 are not intended to limit the present invention. Indeed, those skilled in the art will recognize that other alternative hardware and/or software environments may be used without departing from the scope of the invention.

What is claimed is:

1. A circuit arrangement comprising:
   (A) a photo-detector configured to receive an optical signal from an optical fiber; and,
   (B) a receiver circuit coupled to the photo-detector and configured to generate a data signal representative of information encoded in the received optical signal, the receiver circuit further configured to generate a monitor signal that is proportional to the peak-to-peak power content of the received optical signal.

2. The circuit arrangement of claim 1, wherein the photo-detector is a photo-diode.

3. The circuit arrangement of claim 1, wherein the receiver circuit includes a transimpedance amplifier.

4. The circuit arrangement of claim 3, wherein the transimpedance amplifier and photo-detector are disposed in an electro-optical package.

5. The circuit arrangement of claim 1, wherein the receiver circuit includes a filter.

6. The circuit arrangement of claim 1, wherein the receiver circuit includes an output power meter circuit.

7. The circuit arrangement of claim 5, wherein the output power meter circuit provides temperature compensation.

8. The circuit arrangement of claim 5, wherein the output power meter circuit corrects for supply voltage variations.

9. The circuit arrangement of claim 5, wherein the output power meter circuit corrects for offset voltage.

10. The circuit arrangement of claim 1, wherein the receiver circuit includes an analog to digital convertor, wherein the monitor signal is output as a digital signal.

11. The circuit arrangement of claim 1, wherein the receiver optical power meter circuit is configured to output the monitor signal on a serial bus.

12. The circuit arrangement of claim 1, wherein the receiver circuit generates the monitor signal without interrupting an active link over which the optical signal is being received by the photo-detector.

13. The circuit arrangement of claim 1, further comprising a memory that stores characterizing coefficients.

14. A method of monitoring the optical power incident on a fiber optic transceiver, the method comprising:
   (A) demodulating an optical signal to generate a data signal; and,
   (B) processing the data signal to generate a monitor signal that is proportional to the peak-to-peak optical power.

15. The method of claim 14, wherein the data signal is a differential signal.

16. The method of claim 15, wherein processing the data signal includes generating a common mode voltage from the differential signal.

17. The method of claim 16, wherein processing the data signal further includes filtering the common mode voltage.

18. The method of claim 17, wherein processing the data signal further includes correcting for drifts in supply voltages, temperature, and offset voltage prior to generating the monitor signal.

19. The method of claim 14, further comprising:
(A) receiving the monitor signal in a host external to the fiber optic transceiver, and
(B) in the host, calculating the peak-to-peak optical power incident on the fiber optic transceiver from the monitor signal.

20. The method of claim 19, wherein processing the data signal includes performing an analog to digital conversion of the monitor signal prior to the host receiving the monitor signal.

21. The method of claim 19, wherein the monitor signal is received in serial format over a serial bus.

22. The method of claim 19, further comprising downloading characteristic data from the fiber optic transceiver, and calculating the peak-to-peak optical power using the downloaded characteristic data.

23. The method of claim 19, further comprising signaling an error when the calculated peak-to-peak optical power falls outside an acceptable range.

24. The method of claim 19, further comprising communicating information with the transceiver over an active link, wherein receiving the monitor signal is performed without interrupting the active link.

25. An apparatus, comprising:
A) a processor-less fiber optic transceiver, including:
(i) a photo-detector configured to receive an optical signal from an optical fiber; and,
(ii) a receiver circuit coupled to the photo-detector and configured to generate a data signal representative of information encoded in the received optical signal, the receiver circuit further configured to generate a monitor signal that is proportional to the peak-to-peak optical power of the received optical signal; and,
(B) a host coupled to the processor-less fiber optic transceiver, the host configured to receive the monitor signal and calculate therefrom the peak-to-peak optical power received, the host further configured to signal an error in response to detecting the peak-to-peak optical output received being outside an acceptable range.

26. The apparatus of claim 25, wherein the receiver circuit is configured to output the monitor signal while an active link is established with the fiber optic transceiver, and wherein the received peak-to-peak optical power is calculated without interrupting the active link.

* * * * *